United States Patent [19]
Todd et al.

[11] Patent Number: 5,119,162
[45] Date of Patent: Jun. 2, 1992

[54] INTEGRATED POWER DMOS CIRCUIT WITH PROTECTION DIODE

[75] Inventors: James R. Todd; David R. Cotton, both of Plano; Taylor R. Efland, Richardson; John K. Lee; Roy C. Jones, III, both of Dallas, all of Tex.

[73] Assignee: Texas Instruments Incorporated, Dallas, Tex.

[21] Appl. No.: 454,811

[22] Filed: Dec. 19, 1989

Related U.S. Application Data

[63] Continuation-in-part of Ser. No. 309,515, Feb. 10, 1989, abandoned.

[51] Int. Cl.$^5$ .............................. H01L 27/02
[52] U.S. Cl. ..................... 357/43; 357/23.4; 357/23.13; 357/42
[58] Field of Search ............ 357/43, 23.4, 13, 42

[56] References Cited

U.S. PATENT DOCUMENTS

| | | | |
|---|---|---|---|
| 4,546,370 | 10/1985 | Curran | 357/43 |
| 4,760,434 | 7/1988 | Tsuzuki et al. | 357/23.13 |
| 4,831,424 | 5/1989 | Yoshida et al. | 357/23.4 X |
| 4,862,233 | 8/1989 | Matsushita et al. | 357/23.4 |
| 4,903,106 | 2/1990 | Fukunaga et al. | 357/43 |
| 4,980,741 | 12/1990 | Temple | 357/23.4 |

OTHER PUBLICATIONS

Andreini, et al., "A new Integrated Silicon Gate Technology Combining Bipolar-Linear, CMOS Logic, and DMOS Power Parts," IEEE Trans. vol. 33, No. 12, pp. 2025-2030, Dec. 1986.

Sun et al., "Modeling of the On-Resistance of LDMOS, VDMOS and VMOS Power Transistors", IEEE Trans., vol. 27, No. 2, Feb. 1980, pp. 356-358.

Fong et al, "Power DMOS for High-Frequency and Switching Applications," IEEE Trans, Vol, 27, No. 2, Feb. 1980, 322-325.

Coen et al., "A High-Performance Planar Power MOSFET", IEEE Trans., vol. 27, No. 2, Feb. 1980, pp. 340-342.

*Primary Examiner*—William Mintel
*Assistant Examiner*—Roy Potter
*Attorney, Agent, or Firm*—Gary C. Honeycutt; Richard Donaldson; William E. Hiller

[57] ABSTRACT

Methods and circuits of integrated DMOS, CMOS, NPN, and PNP devices include self-aligned DMOS (411) with increased breakdown voltage and ruggedness for recovery from transients including additional Zener diodes (402/474).

3 Claims, 17 Drawing Sheets

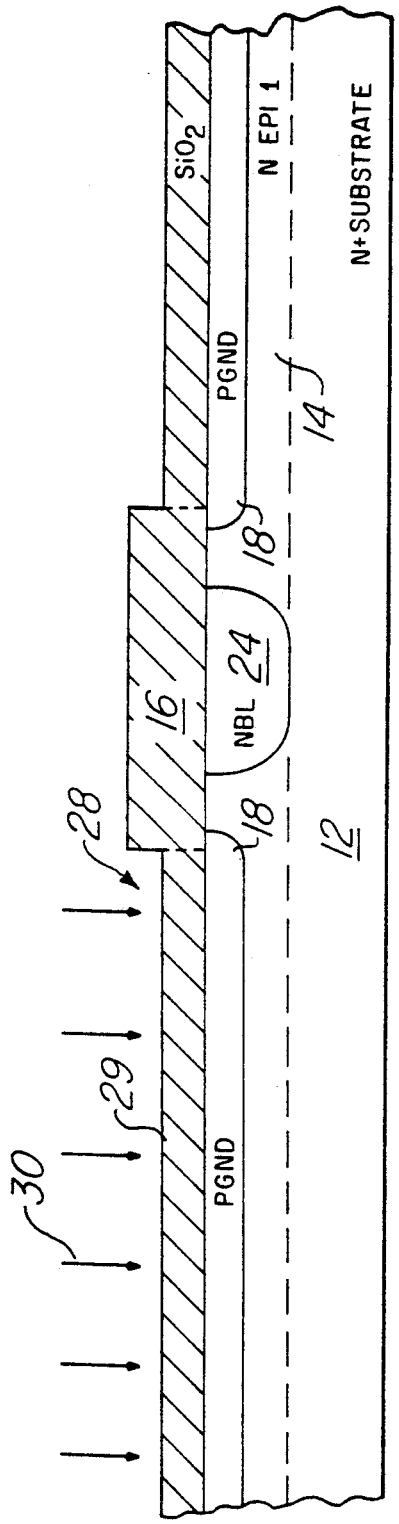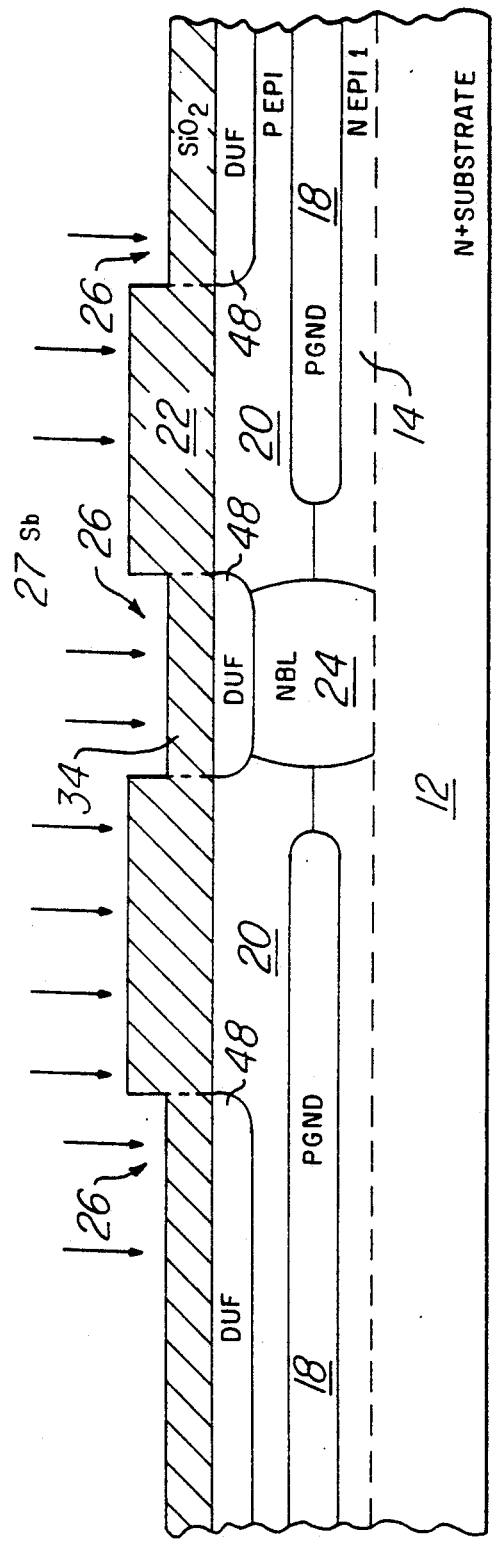
Fig. 4a
Fig. 4b

INTEGRATED POWER DMOS CIRCUIT WITH PROTECTION DIODE

CROSS-REFERENCE TO RELATED APPLICATIONS

This application is a continuation-in-part of copending U.S. application Ser. No. 309,515, filed Feb. 10, 1989 (Mosher et al), now abandoned. Copending U.S. application Ser. Nos. 309,452, filed Feb. 10, 1989, now abandoned, and 309,514, filed Feb. 10, 1989, which issued as U.S. Pat. No. 5,051,612 on Sep. 24, 1991, disclose related subject matter. All of these cross-referenced applications are assigned to the assignee of this application.

BACKGROUND OF THE INVENTION

1. Field of the Invention

The present invention relates generally to the integration of semiconductor control and power devices, and methods of manufacturing same.

2. Description of the Related Art

Traditionally, discrete and integrated circuit power transistors were fabricated in bipolar form. This was largely due to the fact that bipolar power transistors emerged as a mature technology before the development of MOS Power devices. Power Bipolar devices have proved to be extremely rugged and have large power handling capabilities. The drawback of bipolar power transistors is that they consume large amounts of power to turn the device on and off and are limited to switching speeds of the order of 50 KHz.

Where a low voltage drop across the power device and a low power dissipation are important or a fast switching speed is required the Power DMOS device has several advantages over its Bipolar counterpart. The Power DMOS device requires a lower power to switch the device on and off and contrary to the Bipolar device it does not require a steady state current to keep it switched on. The Power DMOS device is also capable of a lower series resistance than the Bipolar device which is limited in some circuits or modes to an inherent voltage drop of approximately 0.6 volt. The combination of the power drop across the device and the power required to drive the device allows the Power DMOS device to dissipate much less heat than its Bipolar counterpart. The Power DMOS device, being a majority carrier device, switches faster than its Bipolar counterpart and further the switching of its gate is compatible with the voltage available from MOS logic drive. The Power DMOS device also has advantages from a ruggedness point of view. Due to the Power DMOS positive temperature coefficient of on-state resistance in the linear region, lateral thermal instabilities do not occur in contrast to Bipolar devices where localized hot spots can cause current hogging and eventual device thermal runaway and breakdown. See for example, Fong et al, Power DMOS for High-Frequency and Switching Applications, 27 IEEE Tr. Elec. Dev. 322 (1980); Coen et al, A High-Performance Planar Power MOSFET, 27 IEEE Tr. Elec. Dev. 340 (1980); and Sun et al, Modeling of the On-Resistance of LDMOS, VDMOS, and VMOS Power Transistors, 27 IEEE Tr. Elec. Dev. 356 (1980).

Integration of DMOS power structures with either or both bipolar or MOS control circuitry are commonly referred to as smart power or integrated power devices. These devices try to achieve the integration of bipolar and MOS technology, commonly referred to as BiCMOS technology, to form integrated circuit chips having power handling devices combined with logic and analog circuit functions. Multi-output power devices can be manufactured on the same silicon die with each power DMOS device totally insulated. Both the drain and the source of the DMOS devices are located on the top side of the silicon die.

A smart power circuit which combines the use of DMOS devices with high voltage NPN and CMOS control logic circuitry is beneficial to the integrated circuit art. Furthermore, such a smart power circuit which could provide a DMOS power transistor which is as rugged if not more rugged than existing DMOS power structures would make such integrated circuit further beneficial.

SUMMARY OF THE INVENTION

The present process employs a self-aligned Power DMOS cell which improves the ruggedness of the device making it less susceptible to secondary breakdown and improves the Safe Operating Area (SOA) of the device under both Reverse Bias and Forward Bias Safe Operating (RBSOA and FBSOA) conditions experienced when driving inductive or commutating loads. Additionally, such a structure is fabricated by a process which if combined with the fabrication of bipolar logic circuitry would not degrade the operating characteristics of either the DMOS, PMOS or NMOS (CMOS) or the bipolar devices.

Die area can be saved when the integration of only a single power device with CMOS and Bipolar circuitry is required. In this case the process may employ a multi-epilayer structure to provide a single output device with the source and drain on opposite sides of the die and which is isolated from the control logic. Unidirectional current flow is achieved straight through the die resulting in a lower $R_{DSon}$ for a given device size.

In accordance with the teachings of the present invention, the present multiepitaxial process for fabricating a high power handling DMOS transistor concurrently with CMOS, PMOS and NMOS, control circuitry, which is also compatible with the integration of bipolar devices, eliminates or reduces the disadvantages and shortcomings associated with known methods and structures.

The inventive methods integrate CMOS devices, bipolar devices (NPN and PNP), and DMOS devices while preserving good performance characteristics for the CMOS and bipolar devices plus ruggedness for the DMOS devices.

BRIEF DESCRIPTION OF THE DRAWINGS

The drawings are schematic and exaggerate the vertical for clarity.

Further features and advantages of the present invention will become more apparent from the following and more particular description of the various embodiments of the invention, as illustrated in the accompanying drawings, wherein:

FIGS. 4a–d are cross sectional elevation view illustrating steps of a second preferred embodiment;

DESCRIPTION OF THE PREFERRED EMBODIMENTS

Figure 1A:
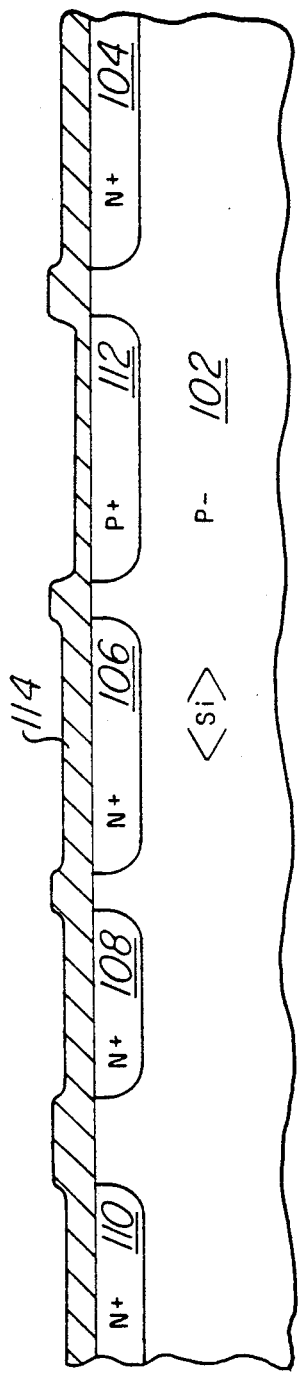
FIGS. 1a-o are cross sectional elevation views illustrating steps of a first preferred embodiment method of fabrication.

FIGS. 1a–o illustrate in cross sectional elevation view steps of the first preferred embodiment method which integrates CMOS, NPN, PNP, and DMOS devices all with top side contacts. Simplified devices (i.e., single source and drain) are shown for clarity. The first preferred embodiment method includes the following steps:

(a) Begin with a P⁻ silicon substrate 102 oriented 4 degrees off <100> and of resistivity 12–16 Ω-cm and thermally grown silicon dioxide (oxide) on substrate 102 to a thickness of 6,500 Å (A). Next, photolithographically locate N-type buried layers 104, 106, 108, and 110 and etch away the oxide at these locations using the patterned photoresist as the etch mask and an HF etchant. Then strip the patterned photoresist. These buried layers may have lateral dimensions on the order of 10 μm by 10 μm, but will vary depending upon the devices being fabricated such as one large buried layer for a DMOS device that includes an array of sources, gates, and drain contacts. Implant antimony at 60 KeV and dose of $2.1 \times 10^{15}$ atoms/cm² to define these buried N layers. The antimony has a projected range of about 200 Å with a projected straggle of about 100 Å, so the 6,500 Å thick oxide provides an implant mask. Diffuse the antimony for 35 hours at 1250° C. in a 10% oxygen atmosphere. This diffusion of the antimony in an oxidizing atmosphere grows oxide over the buried layers 104, 106, 108, and 110 to a thickness of about 1 μm. The antimony will further diffuse during subsequent anneals and oxidations, but no explicit comments will be made in the following.

Next, photolithographically locate buried P-type layer 112 and etch away the oxide at this location using the patterned photoresist as the etch mask and an HF etchant. Strip the photoresist and thermally grow pre-implant oxide to a thickness of 825 A on the exposed silicon. Implant boron at 50 KeV and dose of $5 \times 10^{14}$ atoms/cm² to define this buried P layer; the boron has a projected range of about 1,600 Å and straggle of about 550 Å, so the 825 Å thick oxide is penetrated but the oxide over the remainder of the wafer provides the implant mask. Diffuse the boron for 200 minutes at 1200° C. in an oxygen atmosphere. The boron also will further diffuse during subsequent anneals and oxidations. See FIG. 1a which shows the oxide 114 with its various thicknesses.

(b) Strip all of oxide 114 and grow in situ doped N-type epilayer 120 by CVD to a thickness of 12 μm and a nominal resistivity of 1.2 Ω-cm. The N-type Epilayer 120 is then oxidized to an oxide thickness of 1.0 μm and the NMOS well (P-well 122) is photolithographically patterned and the oxide etched. P-well 122 is formed by a Boron implant dose of 5.5E13 atm/cm² at 80 kev through a 825 Å pre-implant oxide layer and diffused at 1200° C. to form a high resistivity well of approximately 800 Ohm/Square with an oxide layer of 5,000 Å. The P-well dose is high enough to set the NMOS field threshold voltage at greater than 20 volts.

Individual device isolation is achieved, when needed, by the formation of P+ isolation regions 130 in the surface of N-type epitaxial layer 120. The P⁻ isolation regions 130 are formed by a surface Boron deposition. The P+ regions are photolithographically defined (not shown) in the existing oxide. The P+ regions 130 may be formed by a variety of methods, such as ion implantation or deposition. In a preferred embodiment the P+ isolation regions are formed through a BBr₃ thermal deposition at 1060° C. followed by a 1100° C. diffusion cycle that yields a sheet resistance of about 25 ohms/square. Up-diffusion of the sub-surface buried P layers 112 and the down diffusion of the co-incident P+ regions 130 combine to form isolation for the surface epi tanks, which will contain the logic components.

Figure 1B:
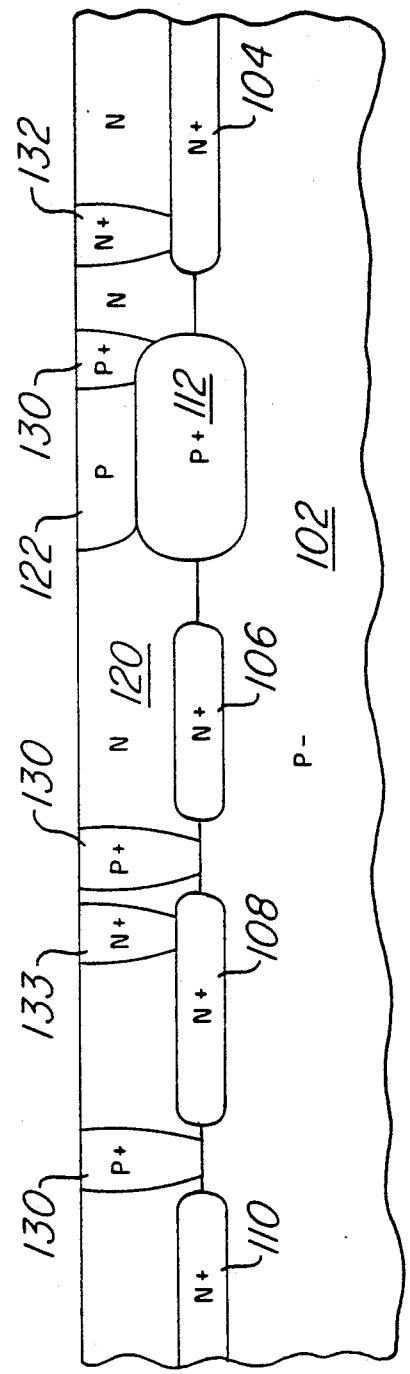

In applications requiring a multi-output power device, with the DMOS drain contact on the top side of the wafer, a deep N+ region 132 is defined to form a low resistivity path to current flow from the buried layer 104 to a DMOS drain contact on the surface of the wafer. The Deep N+ region 132 is photolithographically defined and etched in the existing oxide and a POCl₃ thermal deposition and diffusion is performed to create a layer with a typical sheet resistance of 1.0 ohm/square covered by an oxide thickness of 4000 Å. In single output devices such as the second preferred embodiment using an N+ substrate as the DMOS collector the Deep N+ is not required as the current flow is out of the substrate. However the Deep N+ may still be employed for guardringing devices such as lateral PNP's to prevent hole injection into buried P layers where this may cause undesirable parasitic effects. It may also be employed where it is advantageous to combine both top side drain and a backside drain power DMOS on the same silicon die. After the N+ diffusion all oxide on the surface of the wafer is completely deglazed. See FIG. 1b.

Figure 1C:
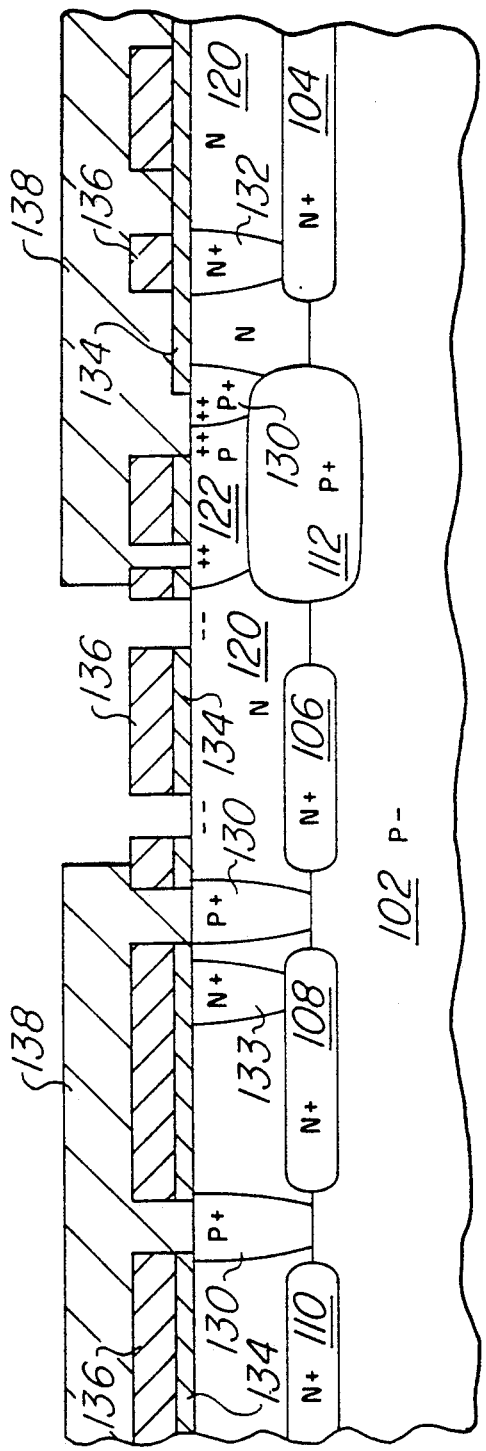

(c) A thin oxide layer of approximately 1600 Å referred to as Pad Oxide 134 is then grown followed by chemical vapor deposition of 1400 A of silicon nitride 136. Nitride 136 is patterned and exposed using standard photolithographic techniques. Next the exposed portion of nitride 136 is plasma etched away to create areas defined as field where thick field oxide will be eventually grown for isolation. The Nitride 136 left on the wafer defines Moat regions into which all further dopants will be selectively diffused. The PMOS field threshold voltage may now be adjusted to avoid parasitic MOS devices created by interconnects which are at a potential lower than the PMOS well potential or by the charging of any surface passivation over N-well from adjacent low voltage nodes. The threshold voltage is adjusted by implanting channel stop Antimony into the N-well while masking other regions by a photolithographically defined mask. The implant does not penetrate Nitride 136 and is self aligned to it and indicated by the —'s in FIG. 1c. FIG. 1c also shows the photolithographic mask 138 for the antimony implant still in place.

The implant (channel stop) dose for the PMOS field threshold adjust is set so that the field threshold is greater than the maximum voltage on the PMOS supply rails and is typically in the order of $2 \times 10^{12}$ atoms/cm$^2$ for 15 volt supply rails.

Figure 1D:
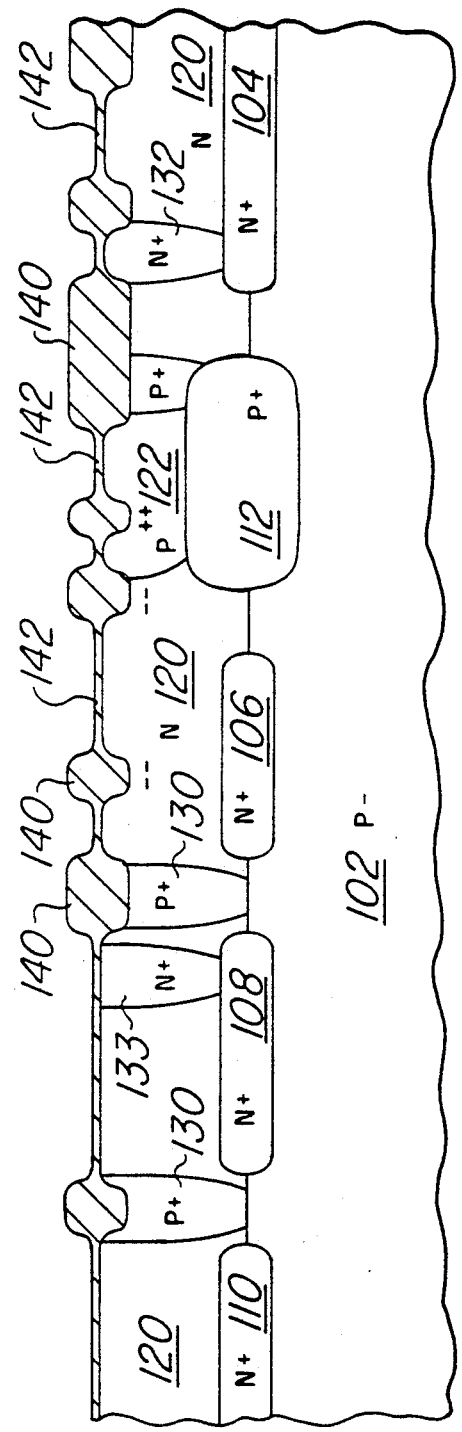

(d) The wafer is then oxidized at 1000° C. to grow a field oxide 140 which is approximately 16,000 Å thick at the end of the process; nitride 136 masks this oxidation. Nitride 136 is then removed from the wafer with phosphoric acid leaving the 825 Å Pad oxide 134 in the windows of the field oxide 140 and into which further doping material is subsequently diffused. These windows are deglazed and a 800 Å sacrificial, or dummy gate oxide, is grown. The dummy gate oxidation is followed by any PMOS or NMOS $V_t$ adjust implants that are required to adjust the PMOS and NMOS $V_t$ to a target value of typically $-1.0$ and $+1.0$ volt, respectively. The $V_t$ adjust implants are masked using photolithographic techniques. The sacrificial oxide is then deglazed and a 800 Å gate oxide 142 is then grown at 950° C. Different gate oxide 142 thicknesses may be used depending on the voltage and electrical performance required from the CMOS and DMOS devices. See FIG. 1d.

Figure 1E:
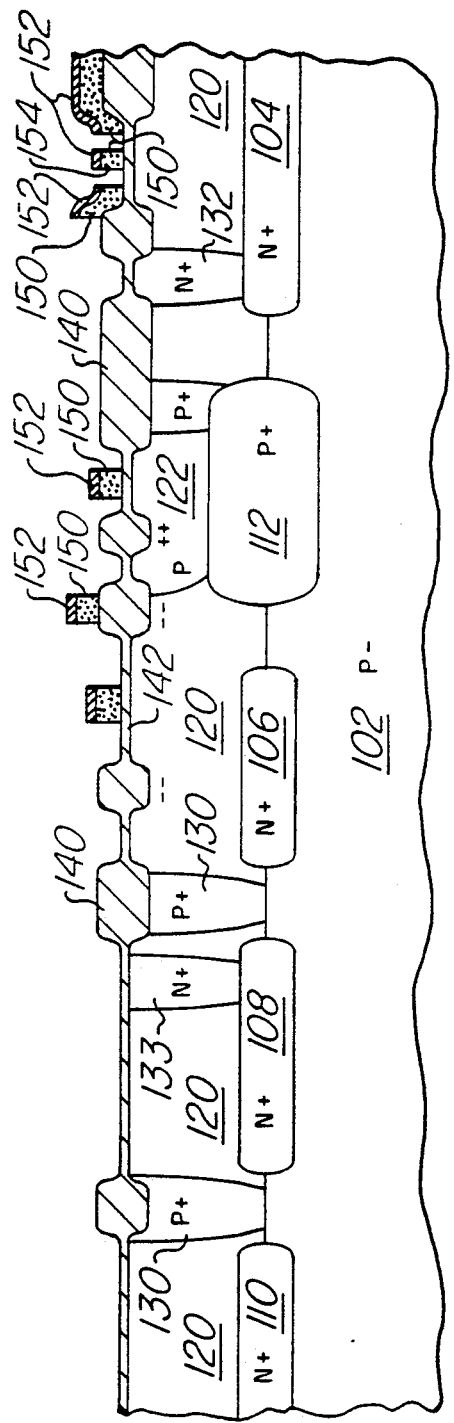
Figure 1F:
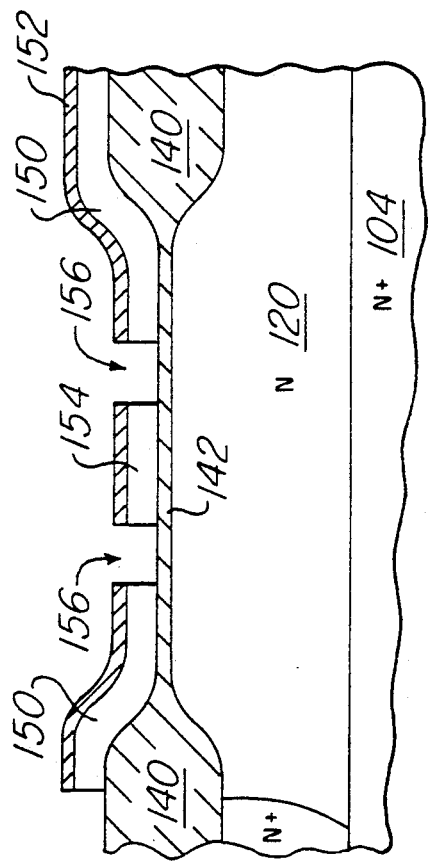

(e-f) A 5000 Å layer 150 of Polysilicon is then chemical vapor deposited followed by a 1400 Å nitride layer 152. Nitride 152 prevents further oxidation of the surface of Poly 150 but, after Poly 150 has been patterned, allows oxidation of Poly 150 sidewalls during subsequent diffusions. This sidewall oxidation can be used to minimize the CMOS and DMOS poly gate Miller capacitance to improve device switching speed. Poly 150 and nitride 152 are then photolithographically patterned and plasma etched to define all Polysilicon interconnects, CMOS and DMOS gates and Poly capacitors. The remaining nitride 152 is aligned to the remaining Poly 150 and is essential to the later formation of the self-aligned P++. A feature of this process is that the P++ diffusion area of the DMOS device will also be defined using the Poly 150 mask in step (g). After the Poly etch a plug 154 of Poly covered by nitride remains in the center of the DMOS source area and prevents the growth of oxide over the P++ region during the subsequent D-well diffusion. See FIG. 1e which shows Poly plug 154 in the righthand portion and FIG. 1f which is an enlarged view of the righthand portion with the vertical scale exaggeration reduced. Poly plug 154 is about 5 μm wide and openings 156 between plug 154 and the adjacent poly 150 are also about 5 μm wide. The total width of gate oxide 142 in FIG. 1f is about 33 μm, so each portion of Poly 150 extends about 9 μm onto gate oxide 142 and extends about 4 μm onto field oxide 140.

Figure 1G:
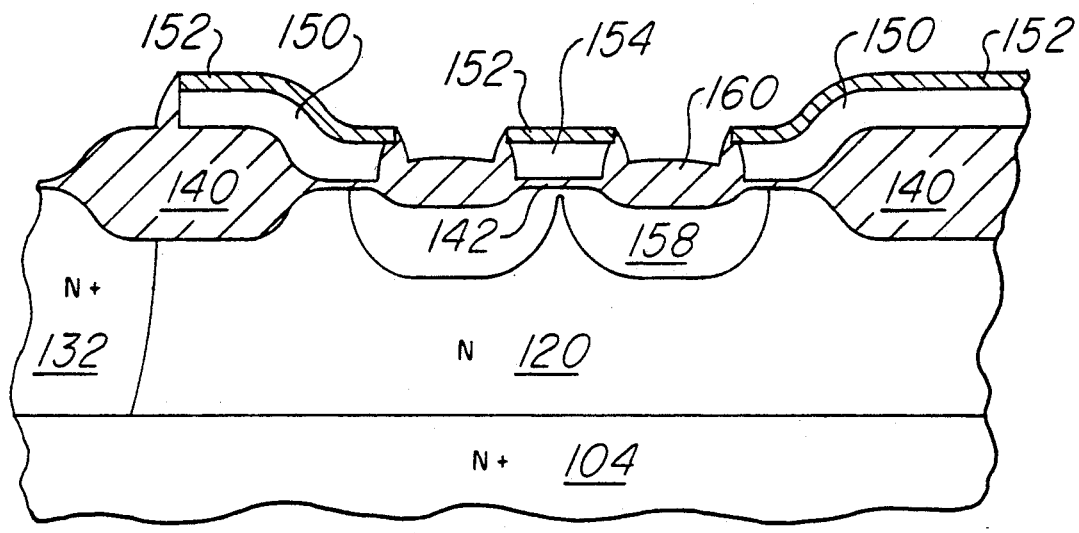

(g) The DMOS well (D-well or DMOS Backgate) is noncritically patterned photolithographically; that is, regions away from openings 156 are masked. The resist mask reveals Moat regions with exposed gate oxide 142 in openings 156 that are not covered by Poly 150 and 154 into which D-well backgate 158 is implanted through the exposed gate oxide 142 with Boron at an energy of 60 kev and a dose of $3.0 \times 10^{14}$ atoms/cm$^2$. The implant does not penetrate Polysilicon 150 and is self aligned to the Polysilicon 150 edges. The implant is then diffused at a temperature of 1150° C. to form a P-type D-well 158 approximately 4 μm deep covered by an oxide layer 160 of 6000 Å thickness. See FIG. 1g which is a view of the same region as FIG. 1f.

Figure 1H:
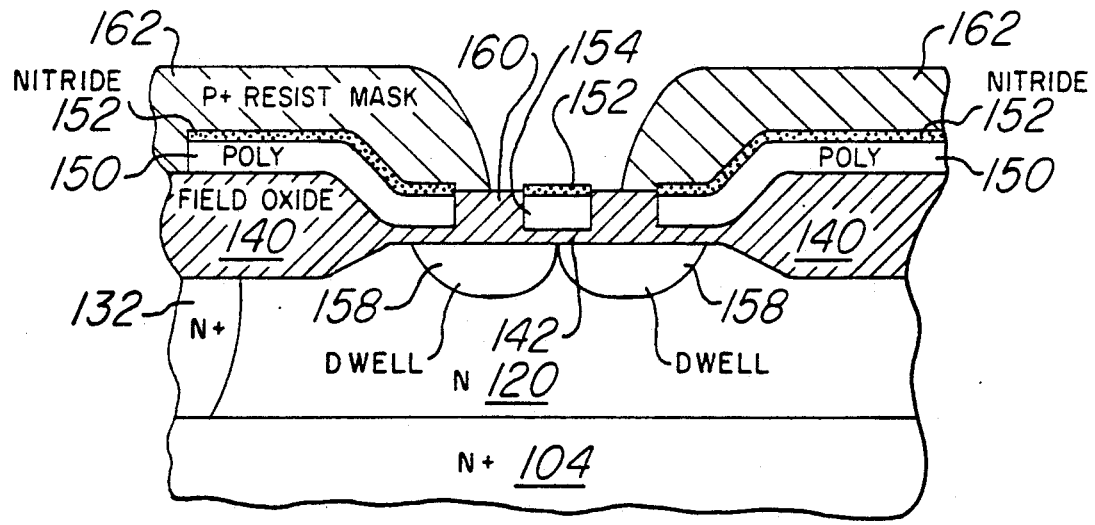

(h) The P++ photoresist mask 162 is then photolithographically defined. It overlaps, by a minimum alignment tolerance, those poly regions where P++ is to be diffused. See FIG. 1h.

Figure 1I:
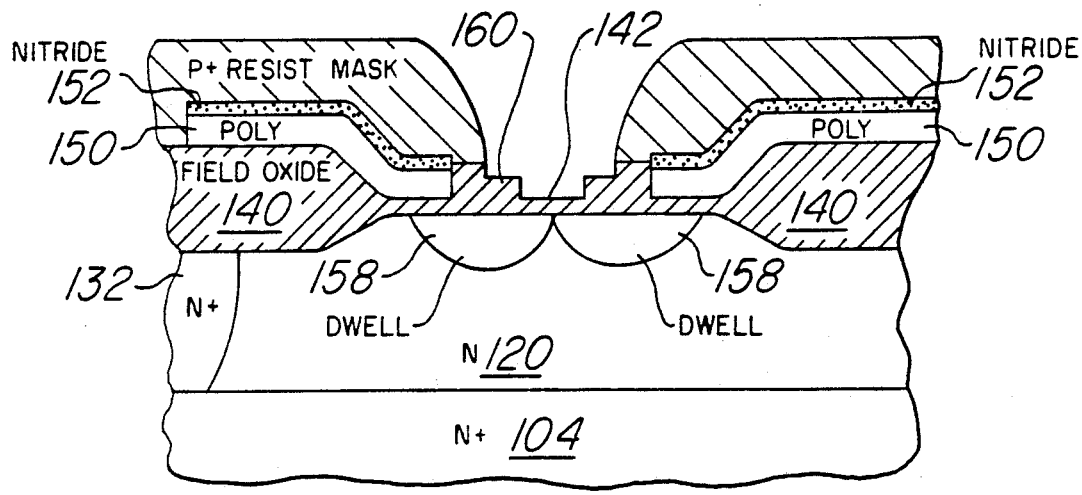

(i) The exposed nitride 152 over Poly 154 and Poly 154 are then plasma etched to reveal the underlying gate oxide 142. The plasma etch has a sufficient etch ratio between the exposed D-well thermal oxide 160 and the exposed nitride 152 and silicon to etch away the exposed nitride 152 and Poly 154 while leaving a minimum of 3000 Å of any exposed D-well oxide 160. See the change in D-well oxide 160 thickness illustrated in FIG. 1i.

Figure 1J:
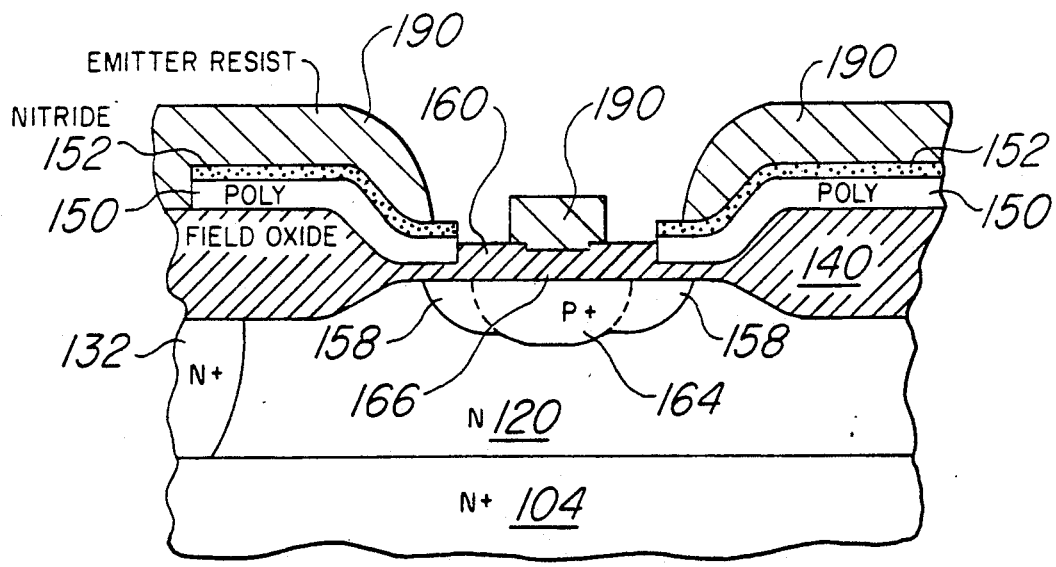

(j) The remaining Gate oxide 142 is then deglazed exposing the bare crystalline silicon into which the P++ boron deposition and diffusion takes place. The P++ regions can be doped using diffusion or implant techniques. In a preferred embodiment, the P++ 164 is formed by deposition at 1060° C. using BBr$_3$ and diffused at 1150° C. to form a P-type layer with a sheet resistance of 10 Ohms per square covered by an oxide 166 of thickness of 4000 Å. See FIG. 1j. The subsequent P++ lateral diffusion under the oxide 160 diffusion mask does not alter the doping profile in the DMOS channel formed by the difference in lateral diffusion of the D-well 158 and DMOS source diffusions 204 (see step (1) below) under the DMOS Poly 150 gate. In this way the DMOS $V_t$ is governed by the peak doping concentration in the DMOS channel (in D-well 158) and it is independent of the doping level of the P++ diffusion 164. The P++ 164 is designed to have a number of electrical characteristics. First, it lowers the resistance of the P-type region below the N+ DMOS source diffusion 204 and it minimizes any parasitic NPN bipolar action that might occur between the DMOS source 204, the DMOS Backgate (D-well) 158 and epilayer 120, and secondly it forms a parasitic Zener diode of breakdown voltage less than that of the parasitic NPN.

The present process employs a self-aligned Power DMOS cell and a self-aligned Zener diode structure (P++/epilayer) which both improves the ruggedness of the device and makes it less susceptible to secondary breakdown thereby increasing the safe operating area (SOA) of the device to withstand transients experienced during the switching of inductive or commutative loads. The self-aligned P++ being designed to absorb all of the energy in the transient due to the large cumulative area of the P++ diodes in the Power DMOS array.

The CMOS source and drain diffusions and bipolar emitter and base diffusions are processed next. These diffusions will be self aligned to Poly 150 where Poly 150 crosses Moat. The diffusions may consist of the BASE (P+) diffusion for the PMOS source and drain and NPN base and PNP emitter and collector, and the EMITTER (N+) diffusion for the NMOS source and drain and NPN emitter and collector contact and PNP base contact diffusions, respectively. The EMITTER diffusion may also be used for the DMOS source diffusion 204 which is also self-aligned to the DMOS Poly gate. The BASE diffusion may also be diffused into the DMOS backgate diffusion to minimize the oxide over the DMOS backgate contact area. Shallower CMOS source and drain diffusions of approximately 1 μm or less junction penetration can be used rather than the deeper BASE and EMITTER diffusions with a consequent saving in device area and an increase in switching speed performance. The shallower NMOS source and drain diffusion may also be used for the DMOS source.

Figure 1K:
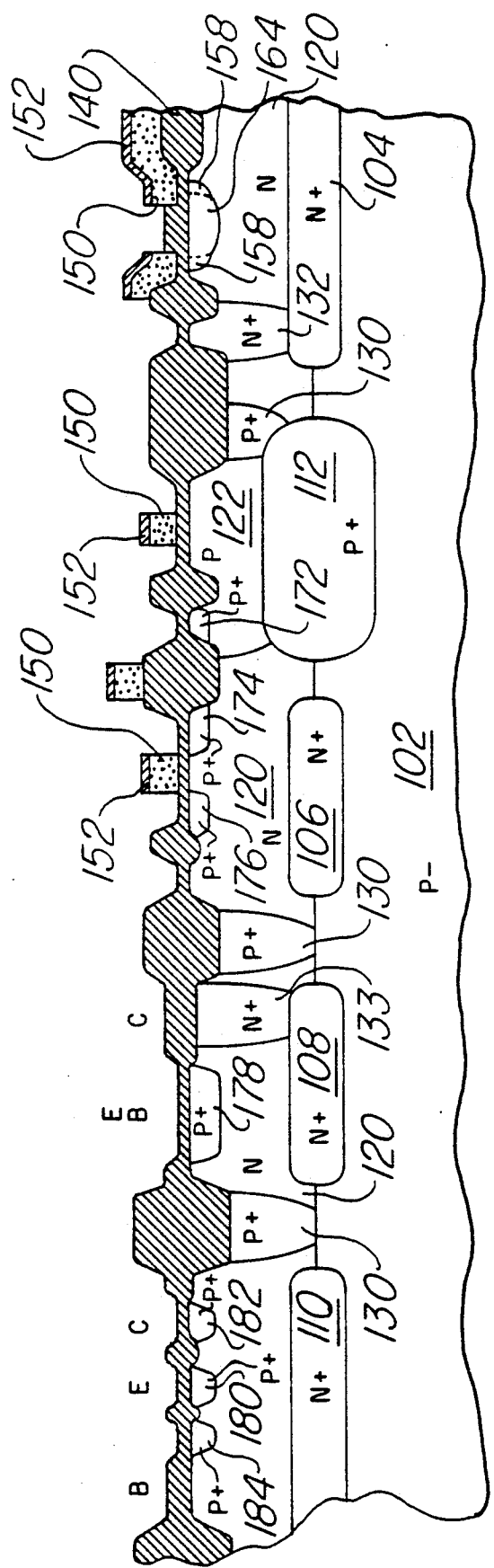
Figure 11:
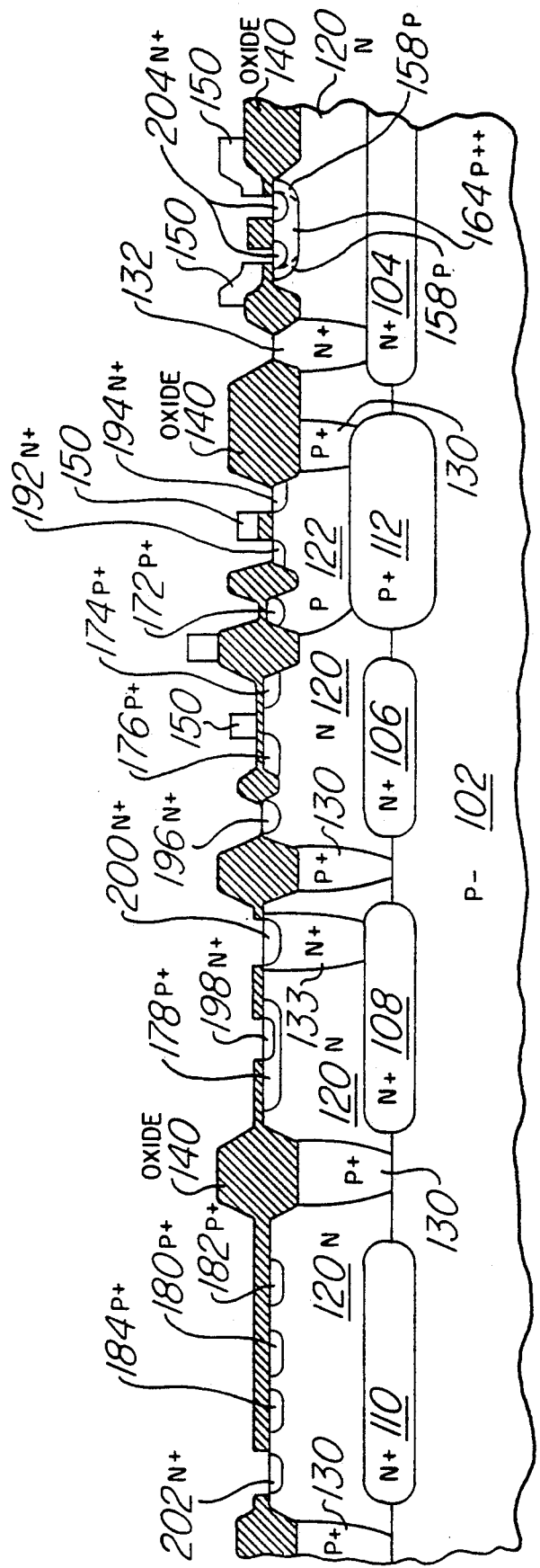

(k) Formation of the BASE regions may comprise deglazing all of the oxide in all Moat regions and thermally growing 825 Å of pre-implant oxide in the exposed regions. The BASE mask is then photolithographically patterned to from a photoresist implant mask for the BASE implant. Thereafter a Boron dose of $6.5 \times 10^{14}$ atoms/cm$^2$ is implanted into the BASE regions at 60 KeV followed by a 1100° C., 100 minute diffusion in nitrogen and a 1000° C., 42 minute stream cycle. This yields a BASE region having a sheet resistance of 160 ohms/square and an oxide thickness of 3400 Å. See FIG. 1k which shows all five device types as in FIGS. 1a–e with BASE regions as follows: NMOS backgate contact 172, PMOS source 174 and drain 176, NPN base 178, and PNP emitter 180, collector 182 (a lateral bipolar) and base contact 184. Nitride layer 152 which is coincident with the Poly 150 is now removed using well known wet etch techniques (phosphoric acid). This opens the Poly 150 to the subsequent EMITTER diffusion which will dope the Poly 150 to a sheet resistance of 20 ohms per square.

Figure 2:
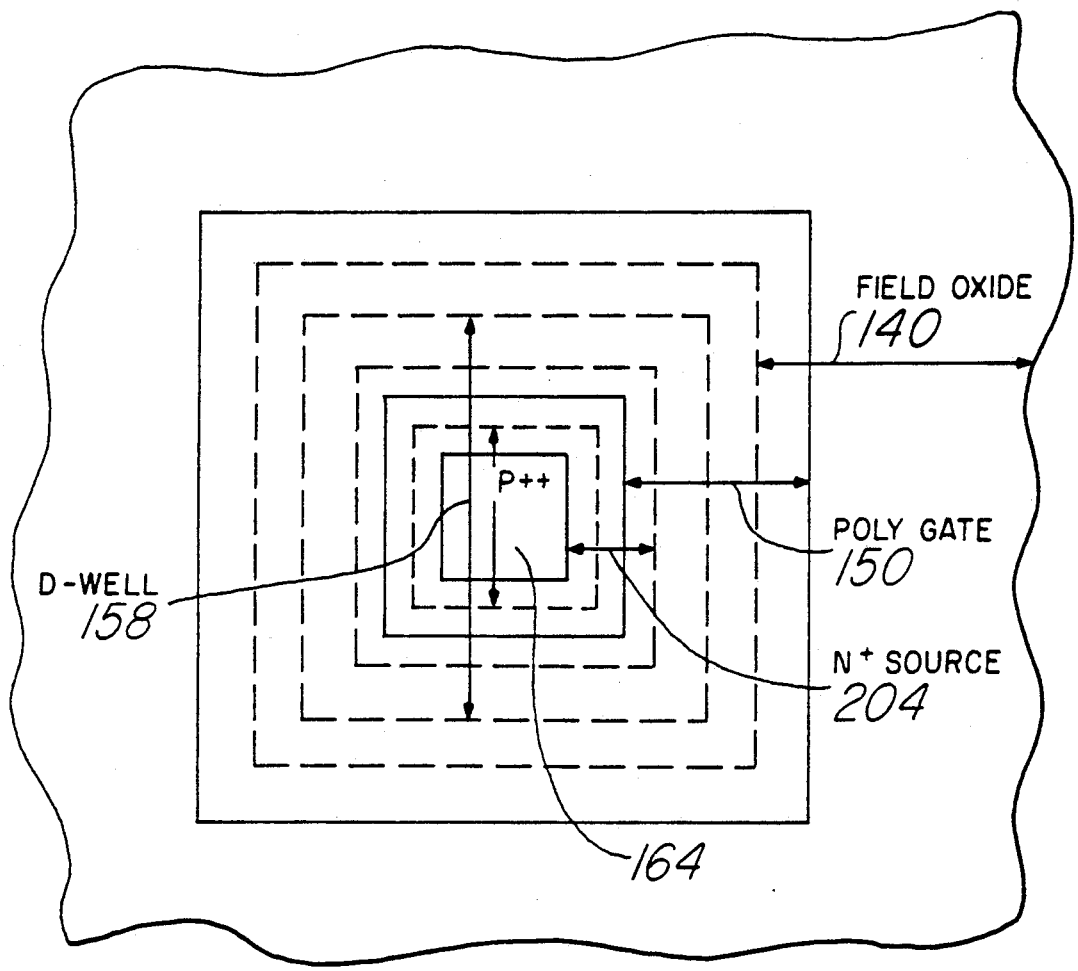
FIG. 2 is a plan view of a portion of the first preferred embodiment.

(l) Photoresist (shown as 190 in FIG. 1j) is again spun on and patterned to etch openings in the oxide layer and POCl$_3$ is deposited and diffused at 950° C. to form phosphorus regions, referred to herein as EMITTER regions, of a depth of about 1.5 μm. The EMITTER diffusion sequence results in regions having a sheet resistance of 10 ohms/square in a preferred embodiment and grows oxide to a thickness of about 2400 Å. These EMITTER regions include NMOS source 192 and drain 194, PMOS well contact 196, NPN emitter 198 and collector contact 200, and PNP base contact 202. DMOS source 204 may also be an EMITTER region; see FIG. 1l. This completes the device active regions, and FIG. 2 is a plan view of the DMOS device. Note that D-well 158 and DMOS source 204 are both aligned to the edge of Poly 150 gate, and P++ 164 is deeper but also aligned to the edge of Poly 150 gate in the sense that the mask that defined the edge of Poly 150 also defined the location of Poly plug 154 which evolved into the oxide opening for P++ 164 formation.

Figure 1M:
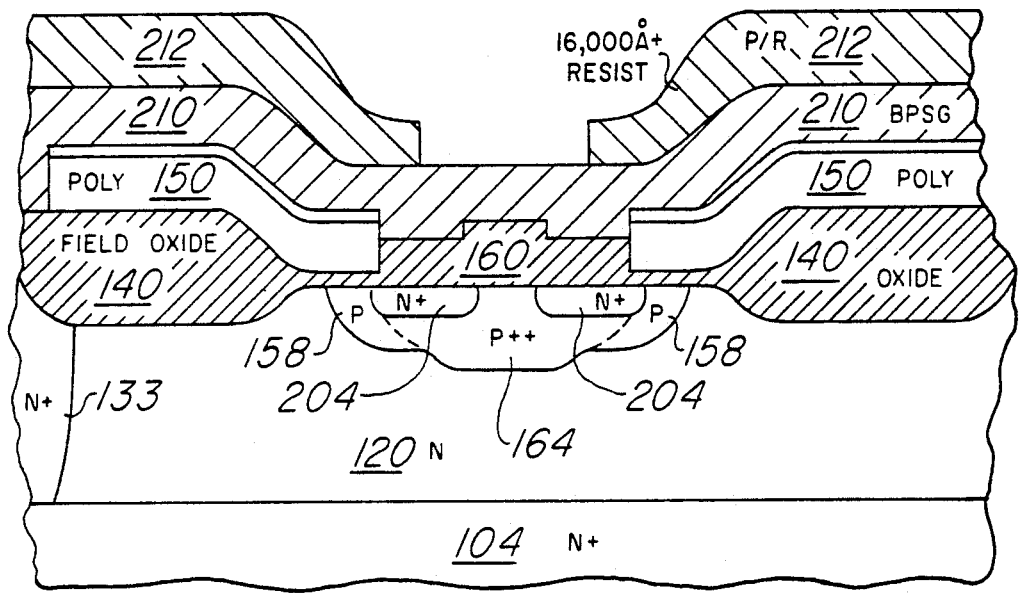
Figure 1N:
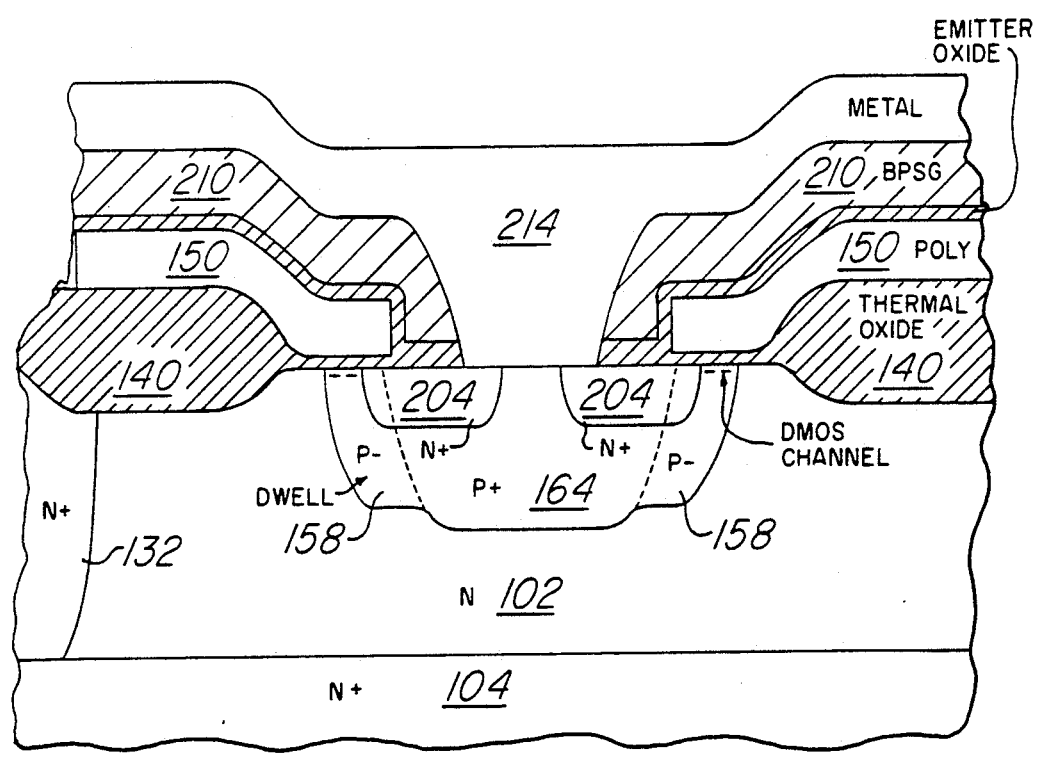
Figure 10:
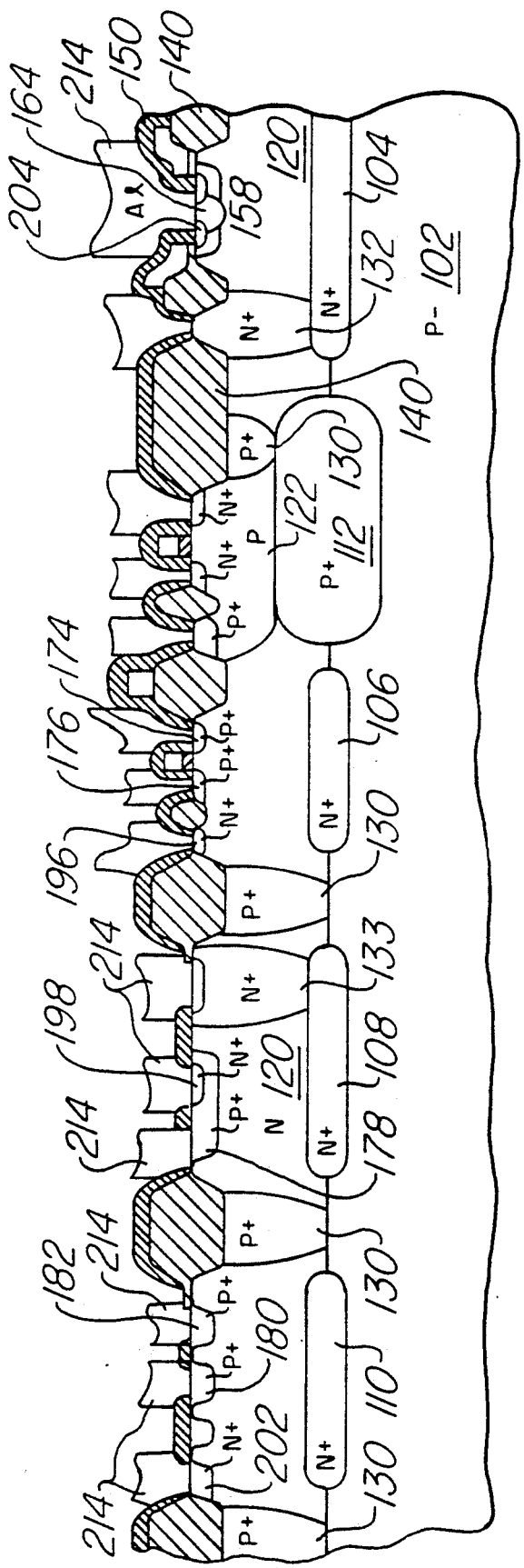

(m-o) After the EMITTER diffusion, a layer of BoroPhosphoSilicate Glass (BPSG) 210 is deposited using CVD techniques to form a high voltage insulating layer between the Polysilicon 150 interconnect and the subsequent metallization. BPSG 210 is then thermally planarized. Photoresist 212 is spun on and patterned to define contacts; see FIG. 1m. BPSG 210 and oxide 160 are removed to open contacts to bare silicon of epilayer 120. BPSG 210 is then reflowed to smooth and slope the opening edges; this further diffuses the dopants. Aluminum metal layer 214 doped with silicon and copper is sputter deposited onto the wafer, patterned and then etched using conventional processing techniques; see FIG. 1n for the same view as that of FIG. 1m and FIG. 1o for the same view as that of FIGS. 1k–l. Note that metal 214 abuts both P++ 164 and N+ source 204 and deters forward biasing of the P-N junctions of parasitic NPN transistors. The metal 214 thickness may be chosen to carry a required current density, but it is typically 2 to 3 μm thick. The wafer processing is complete with the deposition of a 1 μm thick Silicon Nitride passivation layer which is patterned and etched to open Bond pads for wire bond contacts to the package leadframe. The backside of the wafer may be ground to achieve a final wafer thickness of 15 mils and a 1 μm thick layer of TiNiAg may be deposited on the backside to achieve a low contact and thermal resistance.

Figure 3:
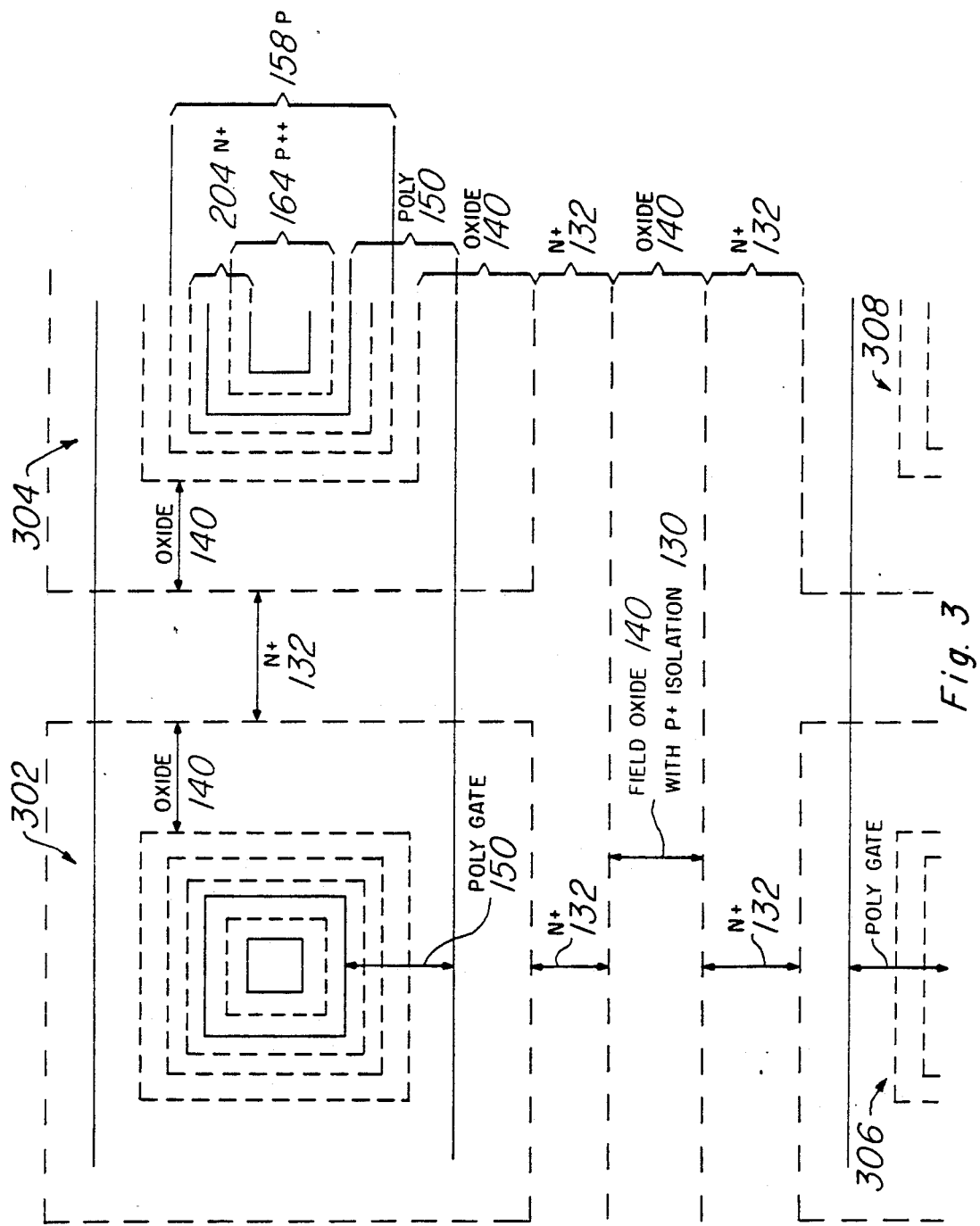
FIG. 3 is a plan view showing multiple first preferred embodiment DMOS cells.

Because of the top side drain contacts for the DMOS structure of the first preferred embodiment, multiple isolated DMOS structures may be fabricated in a single die. FIG. 3 is a plan view that illustrates two adjacent DMOS cells 302 and 304 which have a common Poly 150 gate plus portions of two more DMOS cells 306 and 308 that are isolated by from cells 302 and 304 by field oxide 140 plus P+ isolation regions 130. The buried N+ layers 104 for cells 302 and 304 are contiguous but isolated from the buried N+ layers 104 for cells 306 and 308; this is analogous to the isolation of buried layer 108 from buried layers 106 and 110 shown in FIG. 1o.

Figure 4C:
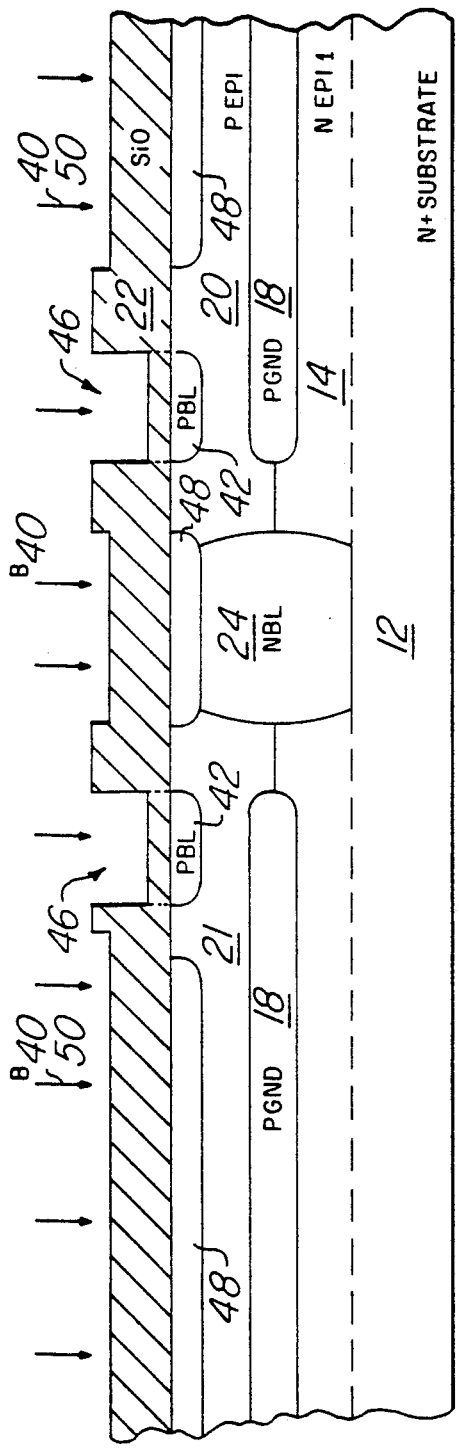
Figure 4D:
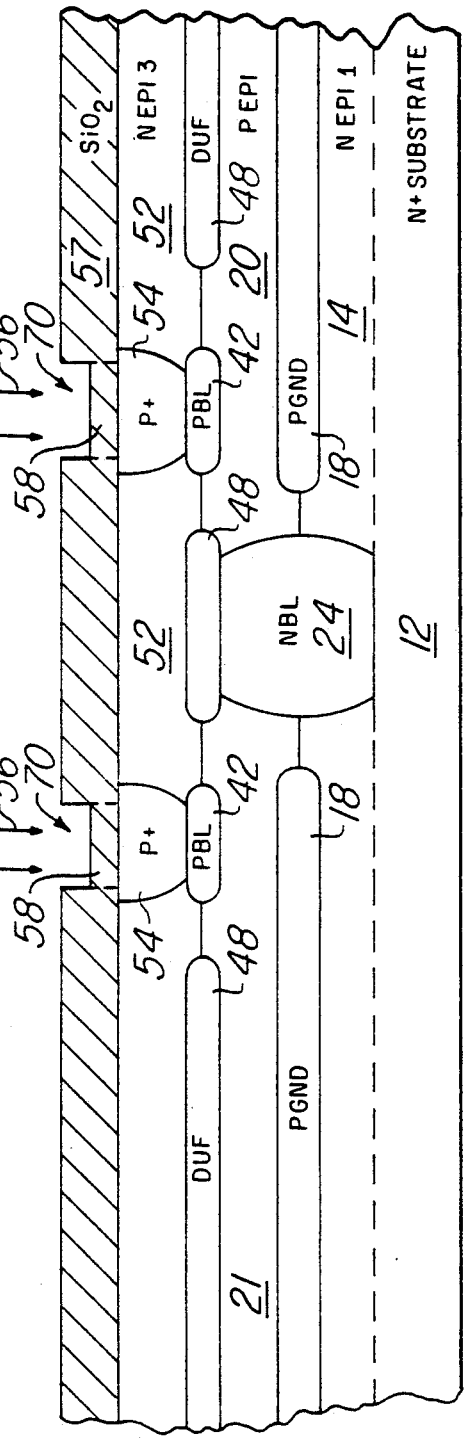

Second preferred embodiment uses three epitaxial layers on a N+ substrate which permits backside contacts for the DMOS devices; this is useful if there is only one DMOS output. Referring now to FIGS. 4a–e, wherein like reference characters designate like or corresponding parts throughout the several views, FIG. 4a depicts a schematic cross-section of a starting silicon substrate or wafer 12 which has a <100> crystal orientation, is highly impurity doped with N conductivity type donor atoms, and has a resistivity of less than 0.02 Ohm-cm. A first N-type epitaxial (epi) layer 14 is formed on wafer 12. Epitaxial layer 14 may be deposited or grown on wafer 12 by conventional and well known methods such as batch reactor or continuous chemical vapor deposition, metalorganic chemical vapor deposition (MOCVD), molecular beam epitaxy (MBE), etc. In a preferred embodiment a thickness of 20 μm and a resistivity of 2.5 ohm-cm is desired.

The exposed surface of epi layer 14 is next thermally oxidized to form an oxide layer 16 with a thickness of approximately 6500 Å. A layer of photoresist (not shown) is spun over oxide 16, and oxide 16 is then photolithographically patterned and exposed to open regions which are to contain the first buried region referred to herein as N Buried Layer (NBL) 24. Alternatively, an E-beam pattern can be used. The preference of photoresist or E-beam resist is immaterial to the present invention. The exposed portion of oxide 16 is removed by stripping in an HF bath or other well known method and subsequently the resist material is removed by stripping or other well known method. Before implantation of the NBL regions, a pre-implant oxide is thermally grown in the exposed region to a thickness of approximately 500 Å. The NBL region 24 is formed by a 60 KeV Phosphorus implant dose of approximately $1.0 \times 10^{15}$ atoms/cm$^2$ through the pre-implant oxide. The wafer is then subjected to a thermal diffusion for 800 minutes at 1200° C. in an oxygen ambient. This forms a 9000 Å oxide layer over NBL regions 24 and the diffusion has a sheet resistance of 35 ohms/square. The NBL layer is used under the Power DMOS device and is designed to minmize the series resistance to current flow between the subsequent DUF diffusion (explained infra) and the N+ substrate 12. The oxide is then photolithographically patterned and etched to open regions for the second buried layer which is a P-type layer referred to as P-ground (PGND). Before implantation of the PGND regions, a pre-implant oxide is thermally grown in the exposed region to a thickness of approximately 825 Å. This region is then implanted with a Boron dose of $1 \times 10^{14}$ atoms/cm$^2$ at 60 KeV to form a layer 6 μm deep with a sheet resistance of 170 ohms/square. See FIG. 4a.

After formation of the PGND and NBL buried regions 18 and 24, the overlying oxides are removed and a P-type epitaxial layer 20 is grown over first epitaxial layer 14. In the second preferred embodiment this second epitaxial layer 20 acts as the ground plane for the control circuitry and is analogous to the substrate 102 of the first preferred embodiment.

The surface of the wafer is next oxidized to form a 6500 Å oxide layer 22 over P-type epitaxial layer 20. Photoresist (not shown) is spun over the surface of the oxide and photolithographically patterned and exposed to form open regions 26 whereat buried N+ Diffusion Under Film (DUF) regions 48 are formed in the exposed region of the wafer. The DUF regions are fabricated using Antimony 27 implant dose of $2.1 \times 10^{15}$ atoms/cm$^2$ at 60 KeV energy followed by a 35 hours, 1250° C. diffusion in a 10% oxygen atmosphere. The resultant DUF regions 48 have a sheet resistance of 25 ohms/square and oxide 34 thickness of 10,000 Å. See FIG. 4b. The sheet resistance is reduced during subsequent processing to 12 ohms/square. Examples of some of the devices which may include DUF regions are the DMOS vertical backside drain output which abuts NBL 24, NPN transistor collector contact, bipolar double diffused low voltage NPN transistor, bipolar high voltage lateral PNP transistor and PMOS transistors. A DUF may be used in a portion of the control circuitry to reduce lateral resistance within a surface tank or to inhibit the punchthrough of surface devices to the underlying P-epi layer.

The oxide layer is again patterned (not shown) and exposed to form openings 46, where P-type buried layers 42, referred to herein as PBLs, will be formed in P-epi layer 20. The PBLs are formed by a Boronw implant dose of $5.0 \times 10^{14}$ atoms/cm$^2$ at 50 KeV through a 825 Å pre-implant oxide formed on the surface of the wafer. The Boron 40 implant is followed by a 200 minutes, 1200° C. nitrogen atmosphere diffusion followed by 105 minutes, 950° C. steam cycle. This sequence results in a sheet resistance of 160 ohms/square and a PLB oxide 44 thickness of 4100 Å. Upon completion of the entire process the PBL sheet resistance will decrease to 130 ohms/square. See FIG. 4c.

Next the photoresist material and oxide are removed and a third, N-type epitaxial layer 52 is then grown over the second epitaxial layer 20 which is P-type. In accordance with the teachings of the present invention this layer can serve different functions such as the DMOS drain, a PMOS backgate, the NPN collector, the lateral PNP base and possibly high value resistors. Accordingly, the thickness and resistivity of epitaxial layer 52 must be selected so as to establish a sufficient breakdown voltage for the DMOS device, the NPN, the Vertical/Lateral PNP and surface logic devices. In a preferred embodiment a nominal resistivity of 1.2 Ohms-cm and a thickness of 12 μm is suitable for a variety of device applications.

Figure 5:
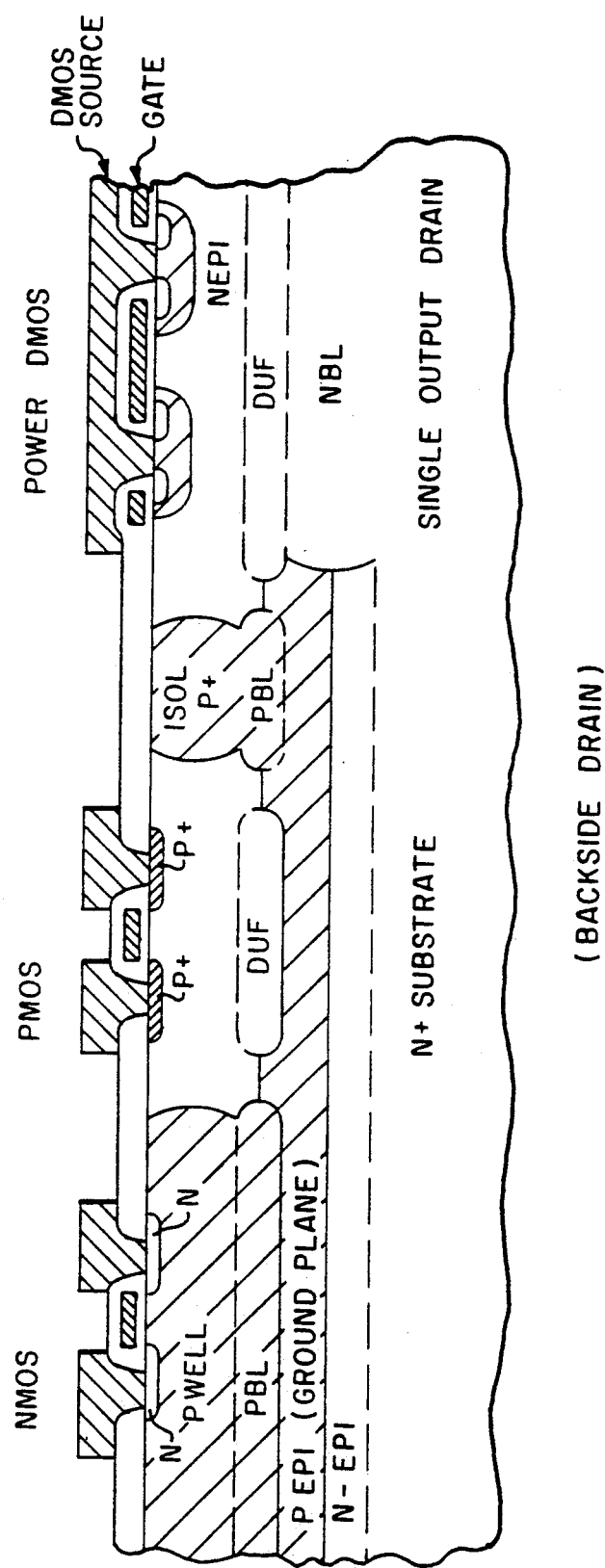
FIG. 5 is a cross sectional elevation view of a portion of the second preferred embodiment devices.

Once P-type epilayer 52 is grown, processing similar to that of the first preferred embodiment may be followed; except the DMOS will not need a topside contact. See FIG. 4d which shows epilayer 52 plus the formation of P+ isolation regions 54 that correspond to formation of isolation regions 130 illustrated in FIG. 1b. Thus P-type epilayer 20 corresponds to substrate 102, N-type epilayer 52 corresponds to N-type epilayer 120, DUFs 48 correspond to N buried layers 106, 108, 110, a PBL 42 without isolation region 54 corresponds to buried P+ layer 112, and NBL 24 plus DUF 48 plus substrate 12 correspond to buried layer 104 plus contact region 132. FIG. 5 is a cross sectional elevation view showing NMOS, PMOS, and DMOS devices with the DMOS having two cells and a backside drain contact through DUF and NBL to substrate.

Figure 6:
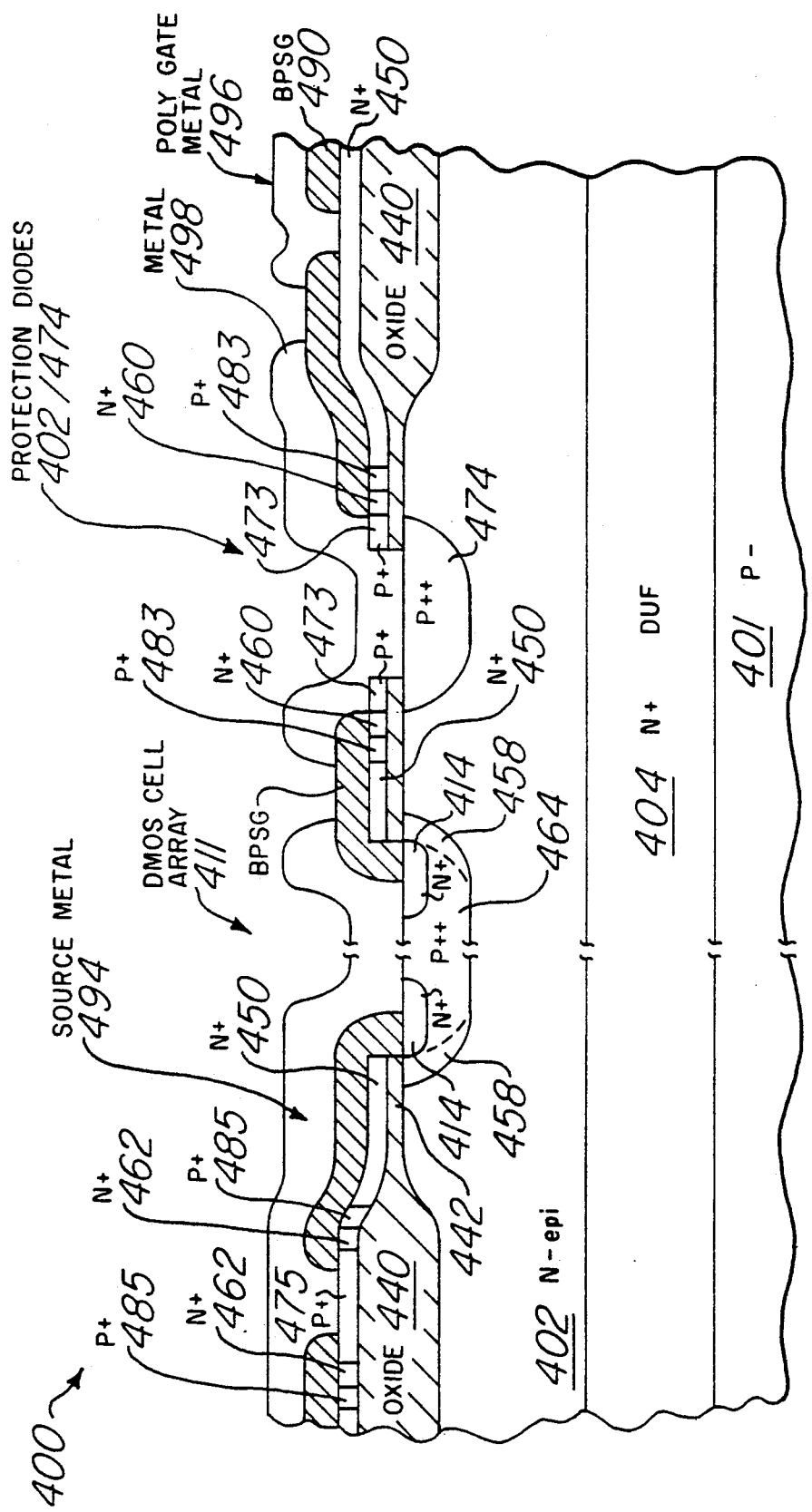
FIG. 6 is a cross sectional elevation view of a portion of the third preferred embodiment.

The third preferred embodiment further improves SOA performance of the Power DMOS of the first or second preferred embodiments by incorporation of additional Zener diodes into the DMOS structure. The self-aligned P++ 164/P 158 structure of the first preferred embodiment dissipates high voltage transient energy in the P++ regions 164 during P−+ 164/N epilayer 102 avalanche conditions. But the third preferred embodiment incorporates additional P++/N Zener diode(s) 474/402 as illustrated in FIG. 6 adjacent the DMOS cell array 411, and diode 474/402 has a breakdown voltage slightly less than that of the P++/N diode 464/402 so that breakdown current will first pass through P++ 474 and avoid damage to the DMOS structure. The breakdown voltage of a junction diode depends upon the curvature of the junction (the electric field increases as the curvature increases), so the breakdown voltage of diode 464/402 may appear to be the same as that of diode 474/402 because the two P++ regions 464 and 474 are formed by the same process steps. However, D-well 458 covers most of the curved boundary portion of P++ region 464 and lowers the electric field; hence the breakdown voltage of P−+ 464/epilayer 402 is higher than that of P++ 474/epilayer 402. A typical example would be a breakdown voltage of 75 volts for P++ 464/epilayer 402 compared to 57 volts for P++ 474/epilayer 402.

FIG. 6 also illustrates the source metal 494, gate metal 496, and diode metal 498; field oxide 440, gate oxide 442, D-well 458, source 414, and P− substrate 401.

Additionally, the third preferred embodiment includes source-to-gate diodes in the DMOS by doping the gate Poly 450 during the BASE implant (see step (k) of the first preferred embodiment) about the openings for P++ regions 474 to form concentric P+ rings 473 and 483 and also concentric P+ regions 475 and 485. That is, after the BASE photoresist mask is formed the exposed nitride over Poly is plasma etched away and then the BASE is implanted and diffused. The remaining nitride over Poly is then removed by phosphoric acid revealing the base polysilicon surface which will be doped by the following EMITTER diffusion (see step (l) of the first preferred embodiment). The BASE diffusion oxide grown over the P+ Poly protects the P+ Poly from the emitter dopants. The number of stacked diodes in Poly could be reduced to one or expanded to three or more.

Figure 7:
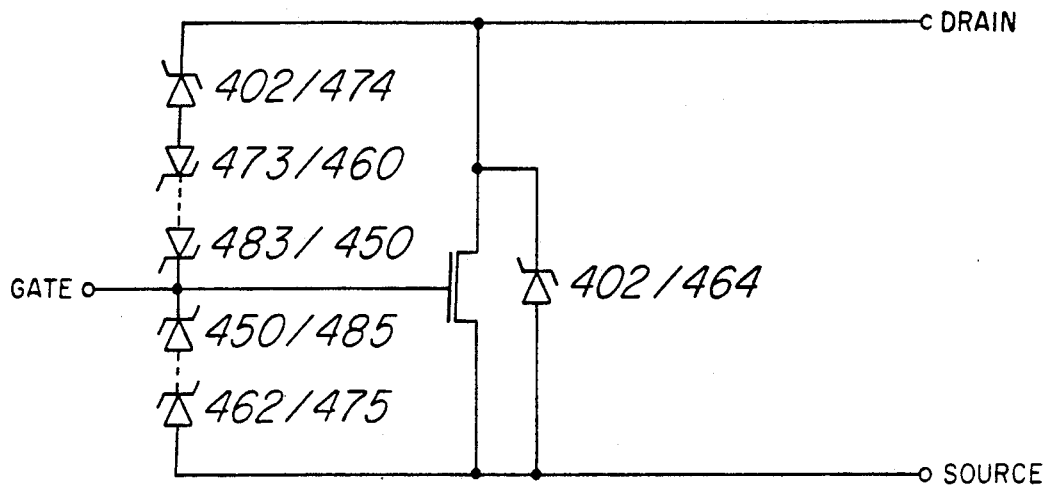
FIG. 7 schematically illustrates diodes of the third preferred embodiment.

The incorporation of P++ 474 results in the turn on of the Power DMOS (gate 450 over D-well 458) during voltage transients so that the whole of the silicon area participates in dissipating transient energy. In particular, drain 404 going to a high voltage yields avalanche conduction into P++ 474 and turns on DMOS gate 450. If the transient drives drain 404 higher due to the inability of the DMOS conductance to discharge the transient, P++ 464 will also avalanche. In this manner both P++ 464 and the DMOS channel participate in dissipating the energy of the transient. Poly diode(s) 473/460 plus 483/450 prevent gate to drain forward biasing on application of gate drive voltage under normal drive conditions. To protect the gate voltage from rising sufficiently to cause gate oxide 442 rupture between gate 450 and source regions 414 one or more additional Zener diodes 450/485 and 462/475 may be incorporated in Poly between gate and source. FIG. 7 shows the various diodes in the DMOS of the third preferred embodiment. Note that the protection Zener diodes may also be fabricated in silicon 102.

Figure 8:
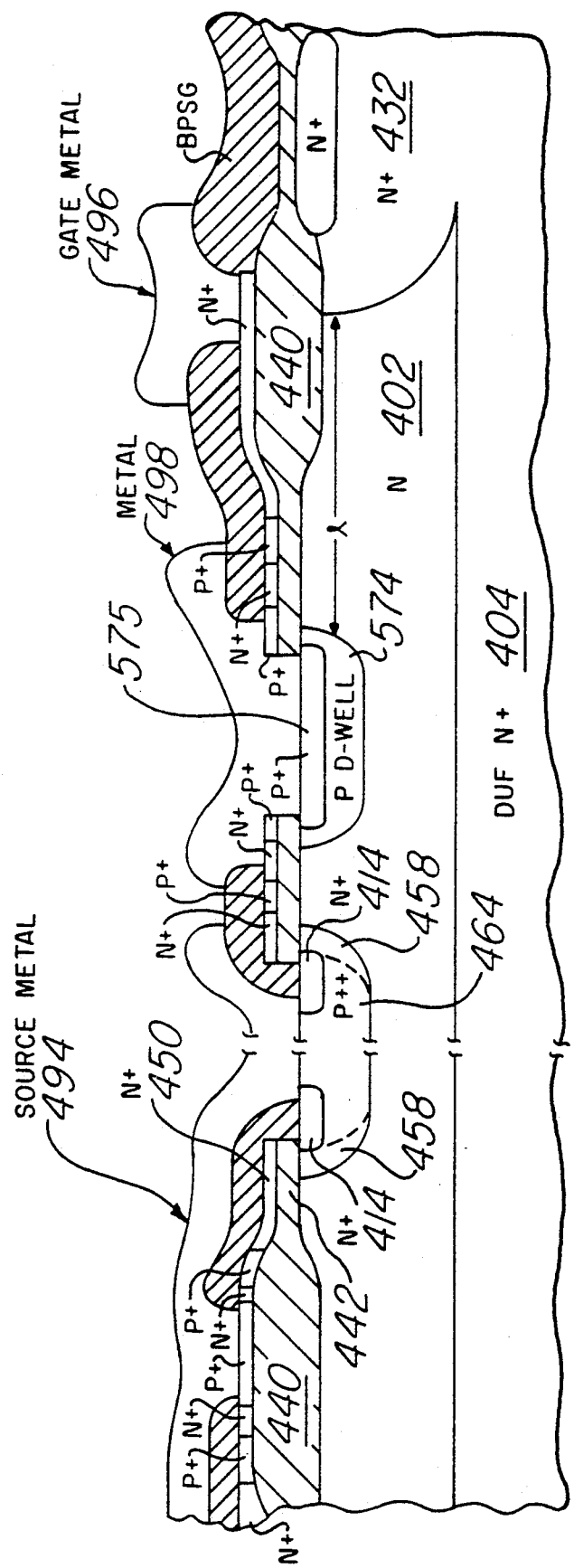
FIG. 8 is a cross sectional elevation view of a portion of the fourth preferred embodiment.

The fourth preferred embodiment shown in FIG. 8 modifies the third preferred embodiment by replacing the P++ 474 with a D-well 574 and P+ contact 575 and using the breakdown of the D-well 574 to N epi 402 lateral diode to dissipate transient energy. The breakdown voltage of this diode is adjusted by varying the spacing "1" between D-well 574 and Deep N+ region 432. This permits setting the breakdown voltage less than the D-well 458-P++ 464/epi 402 breakdown voltage.

Figure 9:
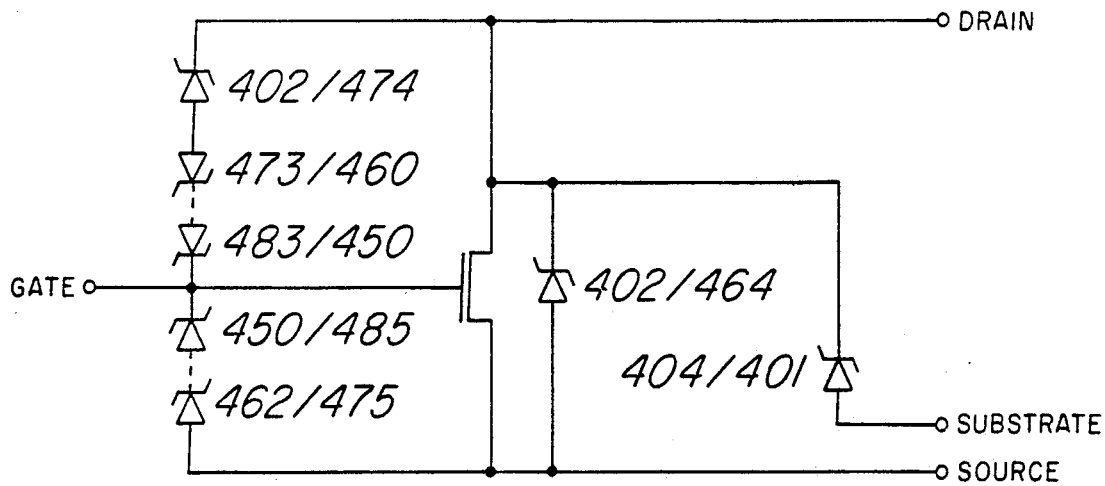
FIG. 9 schematically illustrates diodes of the fifth preferred embodiment.

The fifth preferred embodiment shown in FIGS. 6 and 9 further improves SOA performance of the Power DMOS by the use of the buried N+ (DUF 404 in FIG. 6 and 104 in FIG. 1o) to P substrate (401 in FIG. 6 and 102 in FIG. 1o) diode which is also optimized to avalanche breakdown in the bulk planar junction at a voltage similar to that of the P++ (474 in FIG. 6 and 164 in FIG. 1o) to N epi (402 in FIG. 6 and 120 in FIG. 1o) diode. In this way the whole of the buried N+ to substrate diode participates in dissipating any high voltage transient energy. The substrate is tied to ground preferably via the backside of the device through the leadframe to minimize series resistance between the drain and ground. In this embodiment the substrate resistivity will be decreased to set the buried N+ to substrate avalanche voltage. Radius of curvature breakdown by the buried N+ is avoided using well known guard ring techniques around the periphery of the buried N+.

From the foregoing, the process steps for fabricating a novel BIPOLAR and complementary metal oxide semiconductor field effect transistor (CMOS) integrated circuit which can also combine on the same substrate one or more DMOS power structures is disclosed. The present invention optimizes the characteristics of these different transistors in a single process flow. The present multiepitaxial process results in device structures having distinct technical advantages over prior art processes and structures heretofore known. For example, the present process for forming field effect transistors, is compatible with a concurrent formation of bipolar analog/digital structures.

The present process results in an integrated circuit device having DMOS power transistors for power applications and complementary MOS devices for logic applications. The DMOS power structure is more rugged and has a higher power handling capability than prior art DMOS devices due to its self aligned P++ diffusion and, where applied, integral Zener diode.

Another technical advantage of the present invention is that the process is compatible with the formation of all types of logic components such as TTL, I²L, etc.

Another advantage of the present process is that any number of desired devices may be included or excluded from the process flow without affecting the overall advantages of the invention. This allows a particular end user to have custom design and application specific circuits fabricated in a mass production process flow.

It is an expected and intended use of the present integrated circuit device that it be operatively interconnected to construct electronic circuit devices capable of providing needed functions and automotive electronics, computer-peripheral applications, high current motor control applications, etc. The versatility of the present process flow allows the fabrication of MOSFET, BiMOS, BiCMOS, and bipolar technology either discretely or with high power or low power devices, without suffering from the problems of known integration methods.

What is claimed is:
1. A DMOS structure, comprising:
 (a) a layer of semiconductor material of a first doping type, said layer forming a DMOS drain region;
 (b) a D-well region in said layer, said D-well region including a lightly doped region of doping type opposite said first doping type;
 (c) a first protection diode in said layer, said diode including a region heavily doped with said second doping type to form a junction with said layer;
 (d) a source region in said layer, said source region heavily doped with said first doping type and aligned to said D-well region, said source region located at the junction of said first protection diode with said D-well region;
 (e) a gate over said D-well region, said gate aligned to the lightly doped region of said D-well; and
 (f) a second protection diode in said layer, said diode including a region of said second doping type, connected to said gate, said second protection diode spaced from said D-well region and located so that the breakdown voltage of the diode formed by said second protection diode with said drain region is less than the breakdown voltage of the diode formed by said D-well region with said drain region.
2. The DMOS structure of claim 1, wherein:
 (a) said layer is silicon;
 (b) said drain region includes both lightly doped and heavily doped N type;
 (c) said D-well region has a portion lightly doped P type and a portion heavily doped P type;
 (d) said source region is heavily doped N type;
 (e) said gate is N type polysilicon insulated from said D-well region by silicon dioxide; and
 (f) said first protection diode includes a region of heavily doped P type;
 (g) wherein said D-well region, first protection diode, source region, and gate are concentric.
3. An integrated circuit, comprising:
 (a) a layer of semiconductor material;
 (b) a least one DMOS structure in said layer, said DMOS structure including a doped D-well region, a doped source region, and a doped protection diode;
 (c) at least one NMOS structure in said layer, said NMOS structure including a doped P-well and a doped source region and a doped drain region;
 (d) at least one PMOS structure in said layer, said PMOS structure including a doped source region and a doped drain region; and
 (e) at least one NPN structure in said layer, said bipolar structure including a doped emitter region and a doped base region;
 (f) at least one PNP structure in said layer, said PNP structure including a doped emitter region, a doped extrinsic base region, and a doped collector region;
 (g) said PNP emitter region and said PNP collector region both of substantially the same depth and doping concentration as said PMOS source region, and said PNP extrinsic base region is of substantially the same depth and doping concentration as said NMOS source region;
 (h) wherein said DMOS source region, said NMOS source region, said NMOS drain region, and said NPN emitter region are all of substantially the same depth and doping concentration, and said PMOS source region, said PMOS drain region, and said NPN base region are all of substantially the same depth and doping concentration.

* * * * *